(12) United States Patent
Weiss et al.

(10) Patent No.: US 8,870,579 B1
(45) Date of Patent: Oct. 28, 2014

(54) THERMALLY AND ELECTRICALLY ENHANCED ELASTOMERIC CONDUCTIVE MATERIALS

(75) Inventors: Roger E. Weiss, Foxborough, MA (US); Clifford Read, Wrentham, MA (US); Everett Simons, Mansfield, MA (US)

(73) Assignee: Paricon Technologies Corporation, Taunton, MA (US)

( * ) Notice: Subject to any disclaimer, the term of this patent is extended or adjusted under 35 U.S.C. 154(b) by 99 days.

(21) Appl. No.: 13/350,484

(22) Filed: Jan. 13, 2012

Related U.S. Application Data

(60) Provisional application No. 61/432,656, filed on Jan. 14, 2011.

(51) Int. Cl.
*H01R 4/58* (2006.01)
(52) U.S. Cl.
USPC ............ 439/66; 439/74; 439/91; 324/755.08; 428/425.9
(58) Field of Classification Search
USPC ............. 324/765, 754, 761, 755.08; 257/737, 257/738, 774, 778–779; 439/66, 74, 91; 428/425.9
See application file for complete search history.

(56) References Cited

U.S. PATENT DOCUMENTS

| | | | |
|---|---|---|---|
| 4,008,300 A * | 2/1977 | Ponn | 264/104 |
| 5,275,856 A * | 1/1994 | Calhoun et al. | 428/41.1 |
| 5,751,068 A * | 5/1998 | McMahon et al. | 257/774 |
| 6,168,442 B1 * | 1/2001 | Naoi | 439/91 |
| 6,270,363 B1 * | 8/2001 | Brofman et al. | 439/91 |
| 6,447,308 B1 * | 9/2002 | McCarthy et al. | 439/91 |
| 6,702,587 B2 * | 3/2004 | Weiss et al. | 439/66 |
| 6,720,787 B2 * | 4/2004 | Kimura et al. | 324/755.09 |
| 6,854,985 B1 * | 2/2005 | Weiss | 439/91 |
| 7,033,184 B2 | 4/2006 | Cornell | |
| 7,362,087 B2 * | 4/2008 | Kimura et al. | 324/755.08 |

* cited by examiner

*Primary Examiner* — Cathy Lam
(74) *Attorney, Agent, or Firm* — Dingman, McInnes & McLane, LLP

(57) ABSTRACT

An elastomeric material includes an elastomeric matrix having one or more outer surfaces and a set of electrically conductive pathways disposed through the elastomeric matrix. The elastomeric material also includes a thermally-conductive and electrically-insulative material, disposed through the elastomeric matrix, which improves the formation of the electrically conductive pathways.

15 Claims, 3 Drawing Sheets

THERMALLY AND ELECTRICALLY ENHANCED ELASTOMERIC CONDUCTIVE MATERIALS

CROSS REFERENCES TO RELATED APPLICATIONS

The present application claims the benefit of U.S. Provisional Application No. 61/432,656, filed Jan. 14, 2011, the entire contents of which is herein incorporated by reference in its entirety.

BACKGROUND

Elastomeric interconnect structures, such as Anisotropic Conductive Elastomer (ACE), are manufactured as a composite of conductive metal elements disposed in an elastomeric matrix. These elastomeric interconnect structures are typically constructed to provide electrical conduction along a single axis and through the thickness of the material. In one arrangement, during the manufacturing process a manufacturer achieves the anisotropic conductivity of ACE by mixing 9-10% magnetic particles by volume with a substantially nonconductive liquid resin such as silicone, forming the mix into a continuous sheet, and curing the sheet in the presence of a magnetic field. The magnetic field causes the magnetic particles to form electrically conductive columns through the sheet thickness of the cured matrix. The resulting structure has the unique property of being resilient and anisotropically conductive.

Elastomeric interconnect structures may be used for permanent interconnection, or used to electrically couple one or more circuit board components to a circuit board in a non-permanent manner either to test the interoperability of the components and circuit board or to electrically exercise (e.g., burn in) the device, which is usually done at an elevated temperature. For example, FIG. 1 illustrates a conventional circuit board component testing system 10 that includes an elastomeric interconnect 12 disposed between a circuit board 18 and a circuit board component 20, such as an integrated circuit (IC). The elastomeric interconnect 12 includes an elastomeric matrix 14 having a set of electrical conductors 16 disposed there through. When the elastomeric interconnect 12 is compressed between the circuit board 18 and the circuit board component 20, individual columns of electrical conductors 16 form electrical connections between one of the conductive pads 22 of the circuit board component 20 and a corresponding conductive pad 25 of the circuit board 18, while maintaining lateral electrical isolation. With such connections, a manufacturer can test the interoperability of the circuit board 18 and circuit board component 20. Once complete, the manufacturer can consecutively replace and test additional circuit board components 20 relative to the circuit board 18 using the same elastomeric interconnect.

SUMMARY

Conventional circuit board components 20 include an electronic device 24 carried by a package 26. During operation, the electronic device 24 generates heat which is conducted to the surrounding package 26. In conventional circuit board component testing systems 10, heat generated by the electronic device 24 is typically removed from the package 20 by a heat sink 28 attached to a top or upper surface of the of the device package 20. The heat sink 28 can either be bonded to the package 20 or pressed to an upper surface of the package 20 using a thermal pad 30 to enhance the thermal contact between the circuit board components 20 and the heat sink 28.

In certain cases, the circuit board component 20 is configured with the electronic device 24 disposed within an air filled cavity 32 in the package 26. This configuration is electrically beneficial for high speed electronic devices, but creates difficulties dissipating the heat generated by the electronic device 24. The air filled cavity 32 provides relatively low thermal connectivity between the electronic device 24 and the surrounding structure of the package 26 for transfer of heat 35 to the heat sink 28. However, contact between the electronic device 24 and an electronic device support surface 34 of the package cavity 32 provides relatively large thermal contact connectivity between the electronic device 24 and the electrical connection side 36 of the package 26. For these high-frequency devices, the heat generated by the electronic device 24 can be conducted through the electrical connection side 36 of the package 26 and to the associated conductive pads 22.

While conventional elastomeric interconnect structure 20 provides electrical connections between circuit board component 20 and the circuit board 18 via the electrical conductors 16, the surrounding elastomeric matrix 14 provides a relatively limited amount of heat transfer between the circuit board component 20 and the circuit board 18.

Embodiments of the present invention relate to thermally and electrically enhanced elastomeric conductive materials. In one arrangement, an elastomeric material includes an elastomeric matrix, such as silicone, having a set of electrical conductors and an additive material disposed throughout the matrix. The additive material has a relatively high thermal conductivity (i.e., at least five times higher than the matrix), while still being an electrical insulator. For example, the additive material can have a thermal conductivity of greater than about 2 Watts/mK. In one arrangement, the additive material can be a ceramic material, such as boron nitride, disposed within the elastomeric matrix at a concentration of between about 10% and 30% of the volume of the elastomeric material. This combination of components results in an electrically anisotropic conductive medium with a relatively high thermal conductivity. When used in conjunction with high-speed circuit board components, the elastomeric material provides electrical communication between the circuit board components and an associated circuit board as well as thermal conduction between the circuit board components and the associated circuit board. Accordingly, the elastomeric material allows for the removal of heat from high-frequency circuit board components during operation.

In one arrangement, an elastomeric material includes an elastomeric matrix having one or more outer surfaces, a set of electrically conductive pathways disposed through the elastomeric matrix, and a thermally-conductive and electrically-insulative material disposed through the elastomeric matrix.

In one arrangement, a sheet of elastomeric material includes an elastomeric matrix having two outer surfaces separated by a sheet thickness, a set of parallel electrically conductive pathways comprising magnetically aligned electrically conductive particles disposed through the elastomeric matrix, and at least 1% by volume electrically-insulative particles with sizes between 1% and 20% of the sheet thickness, disposed within the elastomeric matrix.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

An elastomeric material includes an elastomeric matrix, such as silicone, having a set of electrical conductors and an additive material disposed throughout the matrix. The additive material has a relatively high thermal conductivity (i.e., at least five times higher than the matrix), while still being an electrical insulator. For example, the additive material can have a thermal conductivity of greater than about 2 Watts/meter Kelvin. In one arrangement, the additive material can be a ceramic material, such as boron nitride, disposed within the elastomeric matrix at a concentration of between about 10% and 30% of the volume of the elastomeric material. This combination of components results in an electrically anisotropic conductive medium with a relatively high thermal conductivity. When used in conjunction with high-speed circuit board components, the elastomeric material provides electrical communication between the circuit board components and an associated circuit board as well as thermal conduction between the circuit board components and the associated circuit board. Accordingly, the elastomeric material allows for the removal of heat from high-frequency circuit board components during operation.

Figure 2:
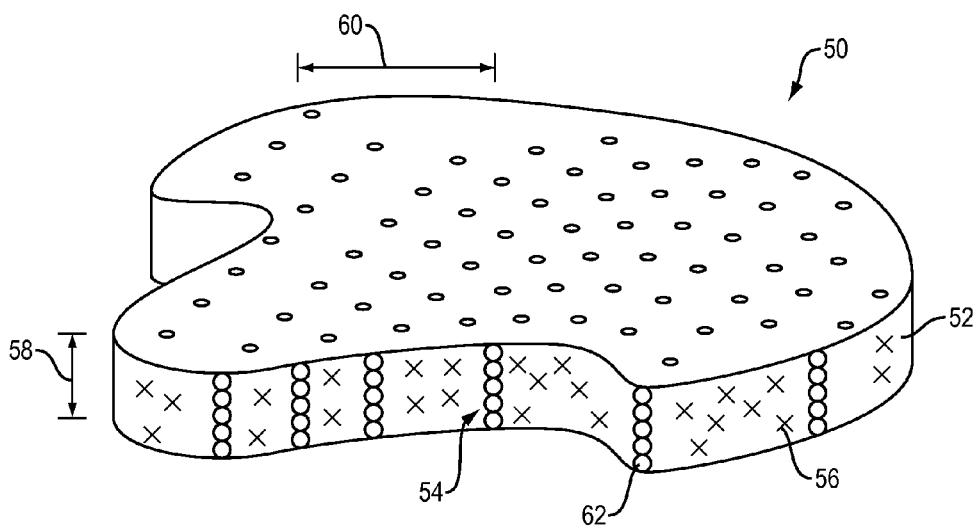
FIG. 2 illustrates a perspective view of a schematic representation of an elastomeric interconnect structure, according to one arrangement.
Figure 3:
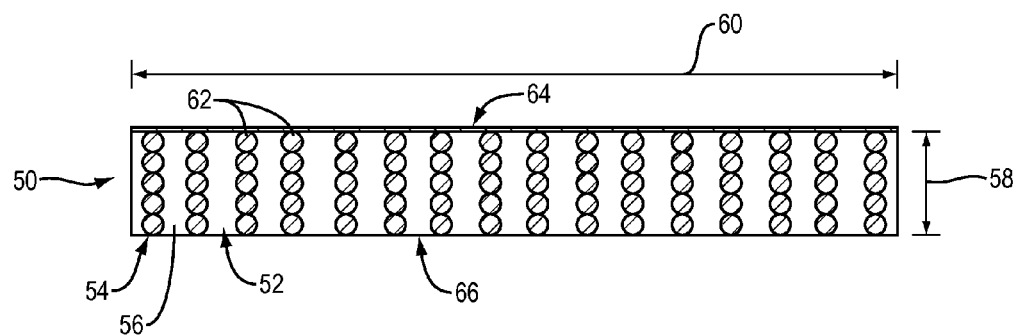
FIG. 3 illustrates a cross-sectional view of the schematic elastomeric interconnect structure of FIG. 2, according to one arrangement.

FIGS. 2 and 3 illustrate a perspective and side view, respectively, of an elastomeric material 50 having an elastomeric matrix 52, such as a silicone material, that includes a set of electrically conductive pathways 54 and thermally-conductive and electrically-insulative additive material 56 disposed there through. In one arrangement, the elastomeric material 50 is configured as anisotropic conductive elastomer (ACE) which conducts electricity along a first dimension 58 (e.g., along a thickness of the elastomeric material 50 between a first outer surface and a second outer surface) and provides electrical insulation along a second dimension 60 (e.g., along a width of the elastomeric material 50, the width being substantially perpendicular to the thickness of the elastomeric material 50). While the elastomeric material 50 can be configured in a variety of thicknesses along the first dimension 58, in one arrangement, the elastomeric material 50 has a nominal thickness of between about 0.1 mm and 0.2 mm.

In one arrangement, the electrically conductive pathways 54 are configured as a plurality of electrically conductive particles 62 aligned substantially along the first dimension 58 of the elastomeric matrix 52. As illustrated in FIG. 3, the electrically conductive pathways 54 extend along the first dimension 58 of the elastomeric material 50 and between a first outer surface 64 and a second outer surface 66 of the elastomeric matrix 52. These pathways 54 are configured to provide electrical communication between a circuit board component, such as a high-frequency device, and a circuit board. While the electrically conductive pathways 54 can include any number of particles 62, in one arrangement the electrically conductive pathways 54 include between four and six particles extending along the first dimension 58 of the elastomeric material 50.

The electrically conductive particles 62 of the electrically conductive pathways 54 can be formed of a variety of electrically conductive and magnetic materials. In one arrangement, the electrically conductive particles 62 are formed of a silver or silver-based material, a nickel or nickel based material, or some combination thereof. Additionally, the electrically conductive particles 62 can range in size from between about 12% and 25% of the thickness of the elastomeric material 50 along the first dimension 58. Typically, the electrically conductive particles 62 can be disposed within the elastomeric matrix 52 at a concentration of between about 9% and 15% of the volume of the elastomeric material 50.

As indicated in FIGS. 2 and 3, the thermally-conductive and electrically-insulative additive material 56 is disposed throughout the elastomeric matrix 52. While a variety of thermally-conductive and electrically-insulative materials 56 can be included in the elastomeric matrix 52, in one arrangement, the material 56 is a ceramic material, such as boron nitride. Boron nitride is a substantially inert material that is commonly available in multiple physical configurations, such as a powder. In one arrangement, the elastomeric material 50 includes at least 1% thermally-conductive and electrically-insulative material 56 with particle sizes between about 3% and 20% of a thickness of the elastomeric material 50 along the first dimension 58 and which are between about 15% and 40% of the size of the electrically conductive particles 62. In the case where the thermally-conductive and electrically-insulative material 56 is boron nitride, at least about 50% of the boron nitride volume has particles between about 3% and 7% of the thickness of the elastomeric material 50 along the first dimension 58 and which are between about 15% and 40% of the size of the electrically conductive particles 62. In one arrangement, at least about 50% of the particles are between five and ten microns having a distribution peak between 6 and 7 microns and are used with electrically conductive particles 62 predominantly between 32 and 38 microns.

A variety of amounts of boron nitride particles can be incorporated into the elastomeric material 50. For example, boron nitride particles can be disposed within the elastomeric material 50 at a concentration of between about 10% and 30% of the volume of the elastomeric material 50. This combination of boron nitride particles relative to the volume of the elastomeric material 50 results in an electrically anisotropic elastomeric material 50 having not only a relatively high thermal conductivity, but also a relatively high electrical conductivity in comparison to comparable materials lacking the thermally conductive particles, as will be described in detail below.

Figure 4:
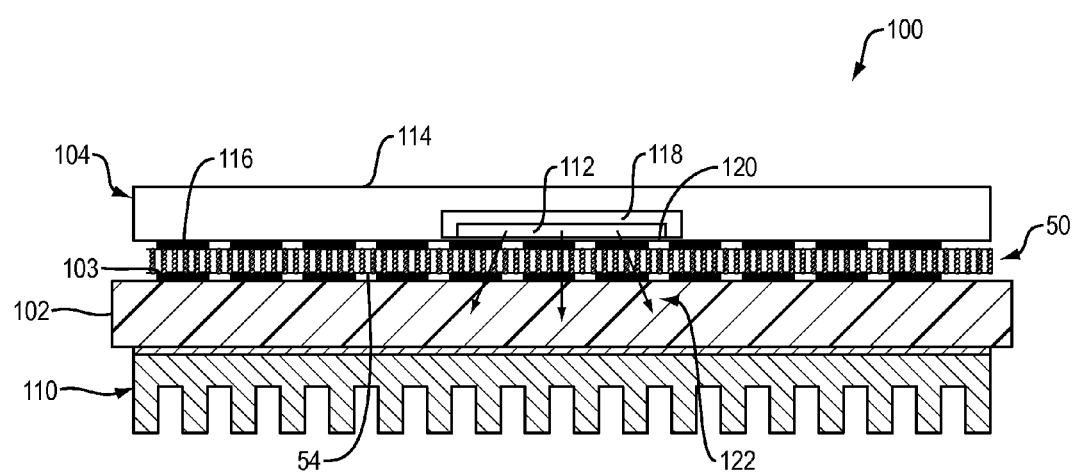
FIG. 4 illustrated a schematic representation of a side view of a circuit board component testing system, according to one arrangement.

To manufacture the elastomeric material 50, a manufacturer blends measured amounts of the thermally-conductive and electrically-insulative particles 56 and the electrically conductive particles 62 into an uncured liquid elastomer (e.g., silicone). The manufacturer then exposed the resulting homogeneous mix to an evacuation process to remove air from the mix. The manufacturer then places the evacuated mix on a carrier sheet which draws the mix through an apparatus, such as a blade or cutting apparatus, to establish a particular thickness of the resulting fluid sheet. The manufacturer disposes the sheet between the poles of a magnet and exposes the fluid sheet to a magnetic field generated by the magnet to drive the conductive particles 62 into column-like structures, such as electrically conductive pathways 54 as indicated by FIG. 4. The magnetic field does not substantially influence the thermally-conductive and electrically-insulative particles 56 during the exposure and, as a result, the particles 56 remain substantially uniformly distributed in the elastomer. The magnet, which is surrounded by an oven, holds the arrangement of the electrically conductive particles 62 substantially in place within the elastomer as heat from the oven cures or hardens the elastomer. The resulting elastomeric material 50, such as illustrated in FIGS. 2 and 3, can be cut into sheets for use as elastomeric interconnect structures 20 to provide electrical connections between a circuit board component and a corresponding circuit board.

As indicated above, the presence of boron nitride particles provides the elastomeric material 50 with not only a relatively high thermal conductivity, but also a relatively higher electrical conductivity. In one arrangement, the boron nitride particles provide the elastomeric material 50 with a thermal conductivity of between about 0.40 Watts per meter Kelvin (W/(m·K)) and 0.50 W/(m·K). Also, as indicated above, the presence of boron nitride particles provides the elastomeric material 50 with a relatively high electrical conductivity, even though the fraction of electrically conductive particles remained unchanged. In one arrangement, the boron nitride particles provide the elastomeric material 50 with an electrical conductivity of between about 0.015 ohms/contact and 0.020 ohms/contact. In one arrangement, and with reference to FIG. 4, a contact relates to a pad 116 of a circuit board component 104 and/or a pad 103 of a circuit board 102 disposed at a particular pitch, such as a pitch of 0.8 mm for example.

Figure 1:
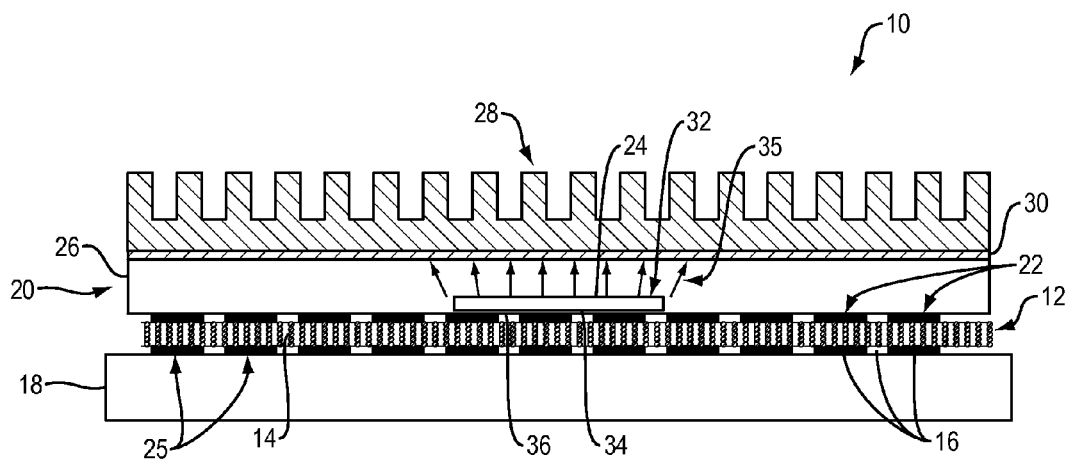
FIG. 1 illustrates a schematic representation of a conventional circuit board component testing system.

For example, the following table, Table 1, provides the thermal conductivity and electrical conductivity measurements for both a conventional elastomeric interconnect material 12, as illustrated in FIG. 1, and the elastomeric material 50.

TABLE 1

|  | Conventional elastomeric interconnect material | Elastomeric material 50 |
| --- | --- | --- |
| Conductive particles | 9%-10% | 10% |
| Boron nitride particles | — | 10% |
| Thermal conductivity | 0.35 W/(m · K) | 0.46 W/(m · K) |
| Electrical conductivity | 0.023 ohms/contact | 0.017 ohms/contact |

As indicated in Table 1, the presence of a thermally-conductive and electrically-insulative material 56, such as boron nitride particles, as part of the elastomeric material 50 provides a relatively high thermal conductivity to the elastomeric material 50 (e.g., an increase in thermal conductivity by more than 24% compared to conventional elastomeric interconnect materials 12). Additionally, the presence of the thermally-conductive and electrically-insulative material 56 as part of the elastomeric material 50 provides a relatively high electrical conductivity to the elastomeric material 50 (e.g., a decrease in resistance per contact or an increase in electrical conductivity of more than 26% compared to conventional elastomeric interconnect materials 12).

In one arrangement, the thermally-conductive and electrically-insulative material 56 is also configured to allow an increase in the amount, by volume, of electrically conductive particles 62 present in the elastomeric material 50. For example, conventional elastomeric interconnect material 12 include a volume fraction of between 9%-10% electrically conductive particles. In these conventional materials 12, when the volume fraction of conductive particles exceeds 11%, lateral short circuits among the particles can typically occur. Inclusion of a thermally-conductive and electrically-insulative material 56, such as boron nitride particles, allows a manufacturer to include a volume fraction of between about 10%-15% electrically conductive particles 62 as part of the elastomeric material 50 while minimizing or eliminating the creation of lateral short circuits within the elastomeric material 50.

The inclusion of such a relatively large (i.e., 10%-15%) volume fraction of electrically conductive particles 62 as part of the elastomeric material 50 provides the elastomeric material 50 with a relatively high thermal conductivity and a relatively high electrical conductivity. For example, with a volume fraction of about 15% electrically conductive particles 62, the thermal conductivity of the elastomeric material 50 can be between about 0.60 W/(m·K) and 0.70 W/(m·K). Also, with a volume fraction of about 15% electrically conductive particles 62, the electrical conductivity of the elastomeric material 50 can be between about 0.010 ohms/contact and 0.015 ohms/contact.

For example, the following table, Table 2, provides the thermal conductivity and electrical conductivity measurements for both a conventional elastomeric interconnect 12, as illustrated in FIG. 1, and the elastomeric material 50 having a 15% volume fraction of electrically conductive particles 62.

TABLE 2

|  | Conventional elastomeric interconnect material | Elastomeric material with 15% volume fraction of electrically conductive particles |
| --- | --- | --- |
| Conductive particles | 9%-10% | 15% |
| Boron nitride particles | — | 10% |
| Thermal conductivity | 0.35 W/(m · K) | 0.66 W/(m · K) |
| Electrical conductivity | 0.023 ohms/contact | 0.012 ohms/contact |

As indicated in Table 2, the presence of a thermally-conductive and electrically-insulative material 56, such as boron nitride particles, as well as a 15% volume fraction of electrically conductive particles as part of the elastomeric material 50 provides a relatively high thermal conductivity to the elastomeric material 50 (e.g., an increase in thermal conductivity by more than 46% compared to conventional elastomeric interconnect materials 12). Additionally, the presence of the thermally-conductive and electrically-insulative material 56 as well as a 15% volume fraction of electrically conductive particles as part of the elastomeric material 50 provides a relatively high electrical conductivity to the elastomeric material 50 (e.g., a decrease in resistance per contact or an increase in electrical conductivity of more than 47% compared to conventional elastomeric interconnect materials 12).

FIG. 4 illustrates an example of a circuit board component testing system 100 that utilizes the elastomeric material 50. For example, the system 100 includes a circuit board 102 having electrically conductive pads 103 disposed on a first side of the circuit board 102 and a heat sink 110 disposed on an opposing side of the circuit board 102. The system 100 also includes a circuit board component 104, such as a high frequency device or integrated circuit (IC) having an electronic device 112 carried by a package 114 as well as electrically conductive pads 116. The electronic device 112 is surrounded on five sides by an air gap 118 and is supported on a sixth side by a base 120 of the package 114.

In use, when the elastomeric material 50 is compressed between the circuit board 102 and the circuit board component 104, individual electrically conductive pathways 54 form electrical connections between conductive pads 116 of the circuit board component 104 and corresponding conductive pads 103 of the circuit board 102. As the circuit board component 104 generates heat during operation, the elastomeric material 50 is configured to carry the heat 122 to the circuit board 102 which distributes the heat to the heat sink 110 to allow prolonged operation of the circuit board component.

While various embodiments of the invention have been particularly shown and described, it will be understood by those skilled in the art that various changes in form and details may be made therein without departing from the spirit and scope of the invention as defined by the appended claims.

As indicated above, in on arrangement, the thermally-conductive and electrically-insulative material 56 is described as a ceramic material, such as boron nitride. Such description is by way of example only. In one arrangement, the thermally-conductive and electrically-insulative material 56 is configured as beryllium oxide. It should be noted that while beryllium oxide is an electrical insulator with a relatively high thermal conductivity, it is also a known carcinogen and should be handled with appropriate precautions.

Also as indicated above, the elastomeric material 50 is described as having both electrically conductive particles 62 and a thermally-conductive and electrically-insulative additive material 56 disposed there through. Such description is by way of example only. In one arrangement, the elastomeric material 50 includes both electrically conductive particles 62 and an electrically-insulative, non-magnetic additive material disposed there through.

While a variety of electrically-insulative materials can be included in the elastomeric matrix 52, in on arrangement, the material 56 is a plastic material. For example, the plastic material can be a plastic powder or plastic particles.

A variety of amounts of electrically-insulative materials can be incorporated into the elastomeric material 50. For example, the electrically-insulative materials can be disposed within the elastomeric material 50 at a concentration of about 1% of the volume of the elastomeric material 50. In one arrangement, the electrically-insulative materials can be disposed within the elastomeric material 50 at a concentration of about 2% of the volume of the elastomeric material 50. Incorporation of the electrically-insulative materials as part of the elastomeric material 50 provides an increase in the amount, by volume, of electrically conductive particles 62 present in the elastomeric material 50. For example, use of the electrically-insulative materials allows the elastomeric material 50 to include at least 13% by volume of electrically conductive particles 62. Such concentration provides a relatively high electrical conductivity to the elastomeric material 50 while minimizing or preventing the presence of electrical short circuits within the material 50.

Additionally, the electrically-insulative materials can have a variety of sizes. For example, the electrically-insulative materials can have sizes between 1% and 20% of the sheet thickness of the elastomeric material 50. Also, in one arrangement, at least 5% of the elastomeric material 50 includes electrically-insulative particles with sizes between 7% and 30% of the magnetically aligned electrically conductive particles 62.

In one arrangement, with the use of electrically-insulative materials, a sheet of the elastomeric material 50 includes an average lateral separation that is less than twice the sheet thickness, such as along a first dimension 58. For example, with reference to FIG. 4, the average lateral separation relates to the distance between adjacent pads, either pads 116 or pads 103. To provide electrical isolation between opposing pads, the electrically-insulative materials provides an average lateral separation within the sheet of elastomeric material 50 to minimize or eliminate electrical short circuiting between adjacent pads, either pads 116 or pads 103.

Figure 5:
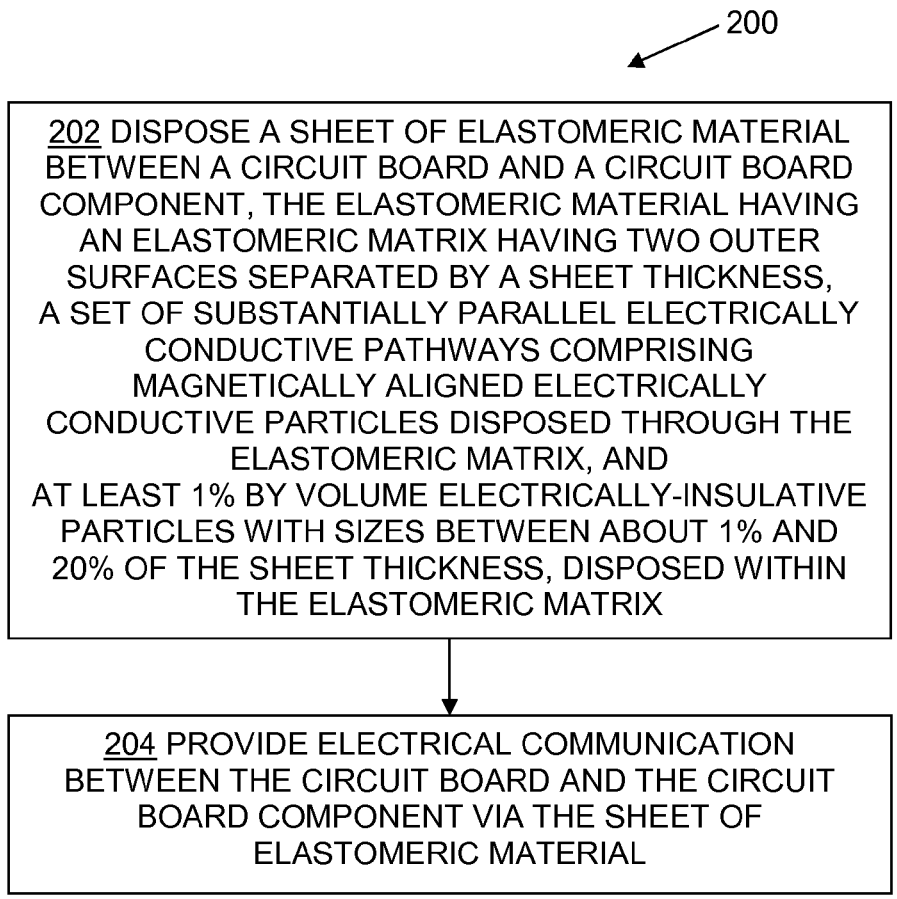
FIG. 5 is a flowchart illustrating a method for electrically exercising a circuit board component.

FIG. 5 is a flowchart 202 that illustrates a method for electrically exercising a circuit board component. Such exercising can be performed as part of either a circuit board component testing or burn in process.

In step 202 a tester disposes a sheet of elastomeric material between a circuit board 102 and a circuit board component 104, the elastomeric material 50 having an elastomeric matrix having two outer surfaces separated by a sheet thickness, a set of substantially parallel electrically conductive pathways comprising magnetically aligned electrically conductive particles 62 disposed through the elastomeric matrix, and at least 1% by volume electrically-insulative particles with sizes between about 1% and 20% of the sheet thickness disposed within the elastomeric matrix. For example, with reference to FIG. 4, the tester places the elastomeric material 50 between the circuit board 102 and the circuit board component 104. With such placement, the electrically conductive particles 62 provide paths for electrical communication between pads 103 of the circuit board 102 and pads 116 of the circuit board component 104.

Returning to FIG. 5, the tester provides electrical communication between the circuit board 102 and the circuit board component 14 via the sheet of elastomeric material 50. For example, with reference to FIG. 4, the circuit board 102 can generate one or more signals and exchange the signals with the circuit board component 104 to either test the operability of the circuit board component 104 or to electrically cycle gates or switches associated with the circuit board component 104 as part of a burn-in procedure.

What is claimed is:

1. A sheet of elastomeric material, comprising:
   an elastomeric matrix having two outer surfaces separated by a sheet thickness;
   a set of substantially parallel electrically conductive pathways comprising magnetically aligned electrically conductive particles disposed through the elastomeric matrix; and
   at least 1% by volume electrically-insulative particles with sizes between about 1% and 20% of the sheet thickness disposed within the elastomeric matrix.

2. The sheet of elastomeric material of claim 1, wherein at least 2% of the elastomeric material comprises electrically-insulative particles with sizes between about 1% and 20% of the sheet thickness.

3. The sheet of elastomeric material of claim 2, wherein at least 5% of the elastomeric material comprises electrically-insulative particles with sizes between about 7% and 30% of the magnetically aligned electrically conductive particles.

4. The sheet of elastomeric material of claim 3, wherein the set of electrically conductive particles comprises at least 13% by volume of the elastomeric material.

5. The sheet of elastomeric material of claim 4, wherein the sheet is configured to define an average lateral separation between adjacent pads of an associated circuit board that is less than twice the sheet thickness, the average lateral separation providing lateral electrical isolation between the adjacent pads.

6. The sheet of elastomeric material of claim 2, wherein the set of electrically conductive particles comprises at least 13% by volume of the elastomeric material.

7. The sheet of elastomeric material of claim 6, wherein the sheet is configured to define an average lateral separation between adjacent pads of an associated circuit board that is less than twice the sheet thickness, the average lateral separation providing lateral electrical isolation between the adjacent pads.

8. The sheet of elastomeric material of claim 1, wherein at least 5% of the elastomeric material comprises electrically-insulative particles with sizes between about 7% and 30% of the magnetically aligned electrically conductive particles.

9. The sheet of elastomeric material of claim 8, wherein the set of electrically conductive particles comprises at least 13% by volume of the elastomeric material.

10. The sheet of elastomeric material of claim 9, wherein the sheet is configured to define an average lateral separation between adjacent pads of an associated circuit board that is less than twice the sheet thickness, the average lateral separation providing lateral electrical isolation between the adjacent pads.

11. The sheet of elastomeric material of claim 1, wherein the set of electrically conductive particles comprises at least 13% by volume of the elastomeric material.

12. The sheet of elastomeric material of claim 11, wherein the sheet is configured to define an average lateral separation between adjacent pads of an associated circuit board that is less than twice the sheet thickness, the average lateral separation providing lateral electrical isolation between the adjacent pads.

13. The sheet of elastomeric material of claim 1, wherein the electrically-insulative particles comprise ceramic particles.

14. The sheet of elastomeric material of claim 13, wherein the ceramic particles comprise boron nitride particles.

15. The sheet of elastomeric material of claim 14, wherein the boron nitride particles are disposed within the elastomeric material at a concentration of between about 10% and 30%.

* * * * *